(12) United States Patent
Yang et al.

(10) Patent No.: US 7,745,282 B2
(45) Date of Patent: Jun. 29, 2010

(54) INTERCONNECT STRUCTURE WITH BI-LAYER METAL CAP

(75) Inventors: Chih-Chao Yang, Poughkeepsie, NY (US); Kaushik Chanda, Fishkill, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 558 days.

(21) Appl. No.: 11/675,705

(22) Filed: Feb. 16, 2007

(65) Prior Publication Data

US 2008/0197500 A1   Aug. 21, 2008

(51) Int. Cl.
*H01L 21/8242* (2006.01)
*H01L 21/4763* (2006.01)
*H01L 21/22* (2006.01)
*H01L 21/38* (2006.01)

(52) U.S. Cl. ............... 438/250; 438/622; 438/653; 257/E21.459; 257/E23.141

(58) Field of Classification Search ........... 438/260, 438/653, 622; 257/E23.141, E21.459
See application file for complete search history.

(56) References Cited

U.S. PATENT DOCUMENTS

| | | | |
|---|---|---|---|
| 5,098,860 A | 3/1992 | Chakravorty et al. | |
| 5,930,669 A | 7/1999 | Uzoh | |
| 5,933,753 A | 8/1999 | Simon et al. | |
| 6,383,920 B1 | 5/2002 | Wang et al. | |
| 6,429,519 B1 | 8/2002 | Uzoh | |
| 2006/0175708 A1* | 8/2006 | Ueno | 257/774 |
| 2007/0298609 A1* | 12/2007 | Yakobson et al. | 438/653 |
| 2008/0032472 A1* | 2/2008 | Yu et al. | 438/250 |
| 2008/0169565 A1* | 7/2008 | Bonilla et al. | 257/761 |
| 2008/0197499 A1* | 8/2008 | Yang et al. | 257/758 |
| 2009/0001587 A1* | 1/2009 | Cotte et al. | 257/751 |

* cited by examiner

*Primary Examiner*—David S Blum
(74) *Attorney, Agent, or Firm*—Ian D. MacKinnon

(57) ABSTRACT

A structure and method of fabricating an interconnect structures with bi-layer metal cap is provided. In one embodiment, the method includes forming an interconnect feature in a dielectric material layer; and forming a bi-layer metallic cap on a top surface of the interconnect feature. The method further includes depositing a blanket layer of a dielectric capping layer, wherein the depositing covers an exposed surface of the dielectric material layer and a surface of the bi-layer metallic cap. The bi-layer metallic cap includes a metal capping layer formed on a conductive surface of the interconnect feature; and a metal nitride formed on a top portion of the metal capping layer. An interconnect structure is also described having an interconnect feature formed in a dielectric layer; a bi-layer metallic cap formed on a top portion of the interconnect feature; and a dielectric capping layer formed over the bi-layer metallic cap.

10 Claims, 11 Drawing Sheets

INTERCONNECT STRUCTURE WITH BI-LAYER METAL CAP

BACKGROUND OF THE INVENTION

1. Technical Field

The present disclosure relates generally to the forming of interconnect structures in semiconductor devices. In particular, the present disclosure relates to a structure and method of forming an interconnect structure with bi-layer metal cap.

2. Description of Related Art

Integrated circuit chips typically include two or more levels of conductive lines which are vertically spaced apart and separated by intermediate insulating layers. Interconnections are formed between the levels of conductive lines in the chip for providing, for example, high wiring density and good thermal performance. The interconnections are formed by means of lines and vias which are etched through the insulating layers separating the levels. The lines and vias are then filled with metal to form interconnect features (i.e. via studs). A typical interconnect structure includes metal vias running perpendicular to the semiconductor substrate and metal lines running parallel to the semiconductor substrate. This process results in multiple levels of conductor wiring interconnection patterns, having individual levels connected by via studs, operating to distribute signals among the various circuits on the chip.

FIGS. 1A and 1B illustrate prior art interconnect or wiring structures including a dielectric layer 12 having a plurality of lines 14a, 14b and 14c formed therein. Lines 14a, 14b and 14c may be formed by first masking an insulating layer with photoresist and then selectively etching a portion of the insulating layer. Using well known photolithographic techniques, lines 14a, 14b and 14c are etched through a cavity formed in the photoresist to form an opening to dielectric layer 12 using isotropic or anisotropic etching processes. Following the etching of lines 14a, 14b and 14c and the removal of the photoresist, a barrier or liner layer 16 is deposited on the bottom and sidewall portions of the lines by means well known in the art. Liner layer 16 includes a material capable of lining the lines so as to prevent the diffusion of later deposited material.

With particular reference to FIG. 1A, lines 14a, 14b and 14c are then filled with a metal layer 18 using deposition techniques well known in the art. Metal layer 18 is then annealed and planarized. Metal layer 18 typically includes a conductive material, usually, Cu. Finally, a dielectric capping layer 20 is deposited over metal layer 18, diffusion barrier 16, and dielectric 12. The completed wiring structure is illustrated by FIG. 1A.

With reference to FIG. 1B, capping layer 20 may include a selectively deposited metal, such as CoWP resulting on a wiring structure having a Cu/metal interference with superior adhesion strength when compared to the typically used Cu/dielectric interface having enhanced electromigration resistance. Despite the improvement in electromigration resistance, however, the use of a metallic capping layer provides an interconnect structure with metallic residue present on a surface of the dielectric material between each conductive feature. This problematic metallic residue is illustrated in FIG. 1B. Specifically, FIG. 1B shows a prior art interconnect structure that includes a dielectric material 12 having conductive features embedded therein. The conductive features include a conductive material 18 which is located within an opening provided in the dielectric material 12. The conductive material 18 is separated from the dielectric material 12 by a diffusion barrier 16. A metallic capping layer 20 is present on the upper exposed surface of each conductive feature, i.e., atop the conductive material 18. As shown, metallic residue 22 forms on the exposed upper surface of the dielectric material 12 during the formation of the metallic capping layer 20. The presence of the metallic residue 22 between each of the conductive features hinders the reliability of the prior art interconnect structure and has delayed using metallic capping layers for the last three generations.

Accordingly, a need exist for a simplified method of forming interconnect structures having a metallic cap which overcomes the shortcomings of the prior art and which is compatible with existing integration schemes.

SUMMARY OF THE INVENTION

The present disclosure is directed to a structure and method of forming an interconnect structure with bi-layer metal cap. In one embodiment, a method of forming an interconnect structure is described. The method includes forming at least one interconnect feature in a dielectric material layer; and forming a bi-layer metallic cap on a top surface of the at least one interconnect feature. The method further includes depositing a blanket layer of a dielectric capping layer, wherein the depositing covers an exposed surface of the dielectric material layer and a surface of the bi-layer metallic cap. The forming of the bi-layer metallic cap includes forming a metal capping layer on a conductive surface of the at least one interconnect feature; and conducting a chemical plasma process for forming a metal nitride on a top portion of the metal capping layer. A surface layer of the dielectric material layer is damaged during the chemical plasma process, and thus the method further includes removing the damaged surface layer. The metal capping layer includes a noble metal. In one particular embodiment, the noble metal is selected from a group consisting of Co, Ir, Ru, Rh, Pd, Pt, Ta, their alloy materials, W, B, P, MO, Re, and a combination thereof.

In one particular embodiment, a hardmask is formed on a top portion of the dielectric material, wherein the interconnect features is embedded within the dielectric material layer and the hardmask. The interconnect feature includes a conductive surface being coplanar with a top surface of the hardmask. In another embodiment, the at least one interconnect feature includes a conductive surface coplanar with a top surface of the dielectric material layer and further wherein the metal capping layer is formed on the conductive surface.

The forming of the at least one interconnect feature includes forming at least one of a line and a via features in the dielectric material layer; conformally depositing a barrier layer in the at least one of a line and a via; and depositing a metal layer over the barrier layer. The metal layer may be selected from a group consisting of Cu, W, Al and Cu alloys. In one particular embodiment, the bi-layer metallic cap is formed within the at least one of a line and a via features. Alternatively, the conductive material layer is partially etched for forming a recessed top conductive surface, where the bi-layer metallic cap is formed on the recessed top conductive surface.

In yet another embodiment, an interconnect structure is described having at least one interconnect feature formed in a dielectric layer; and a bi-layer metallic cap formed on a top portion of the at least one interconnect feature. The interconnect structure further includes a dielectric capping layer formed over the bi-layer metallic cap. The at least one interconnect feature includes a conductive material layer and a diffusion barrier layer surrounding the conductive material layer. In one embodiment, the conductive material layer includes a top surface coplanar with a top surface of the dielectric layer bi-layer. In another embodiment, the at least one interconnect feature includes a recessed portion, wherein the bi-layer metallic cap is positioned in the recessed portion.

The bi-layer metallic cap includes a metal capping layer and metal nitride of the metal capping layer. In one embodiment, the metal capping layer includes a noble metal, where the noble metal is selected from a group consisting of Co, Ir, Ru, Rh, Pd, Pt, Ta, W, B, P, MO, Re, and their alloys.

Other features of the presently disclosed interconnect structure with bi-layer metal cap will become apparent from the following detail description taken in conjunction with the accompanying drawing, which illustrate, by way of example, the presently disclosed interconnect structure with bi-layer metal cap.

BRIEF DESCRIPTION OF THE DRAWINGS

The features of the presently disclosed interconnect structure with bi-layer metal cap will be described in detail hereinbelow with references to the figures, wherein.

DETAILED DESCRIPTION

Figure 1A:
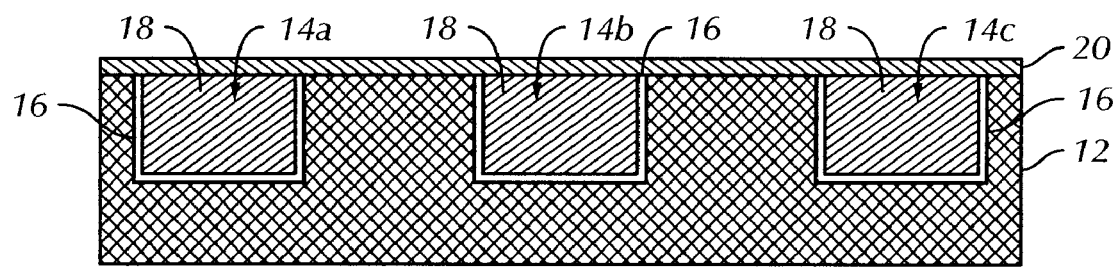
FIGS. 1A and 1B illustrates simplified cross-sectional views of interconnect structures of the prior art.
Figure 1B:
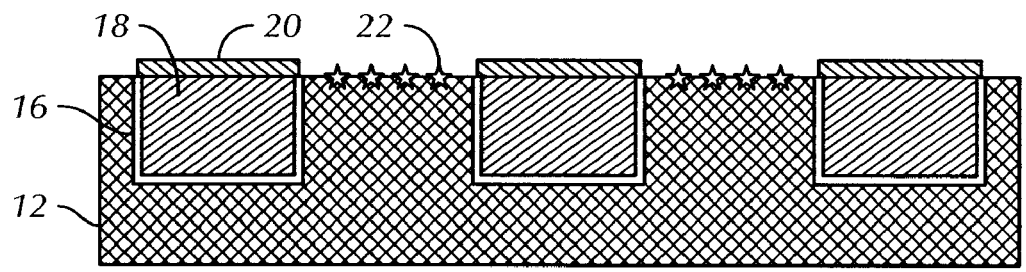
Figure 2:
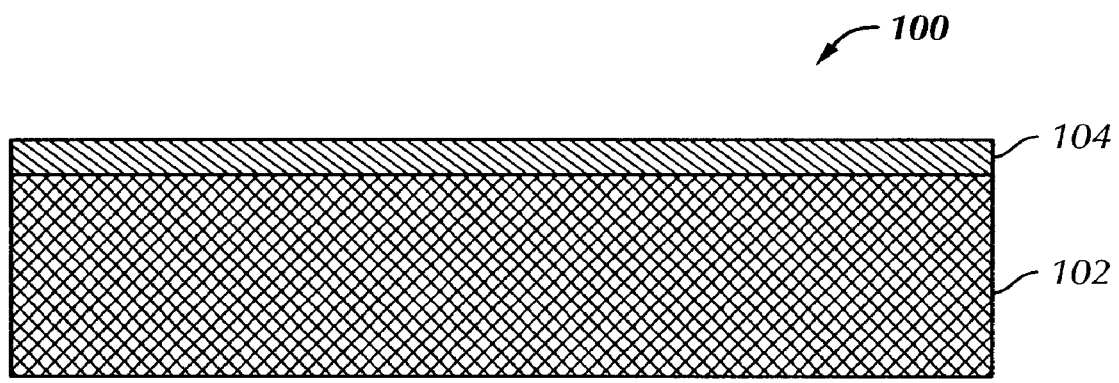
FIGS. 2-3 illustrate cross-sectional views of a semiconductor structure formed using conventional lithographic process.

Referring now to the drawing figures, wherein like references numerals identify identical or corresponding elements, various embodiments of the presently disclosed interconnect structure with bi-layer metal cap will be described in detail. In the following description, numerous specific details are set forth (e.g. particular structures, components, materials, dimensions, processing steps and techniques) to provide a thorough understanding of the present disclosure. However, it will be appreciated by one skilled in the art that the invention described herein may be practiced without these specific details. In addition, well-known structures or processing steps have not been described in detail to avoid obscuring the invention. The materials described herein are employed to illustrate the invention in one application and should not be construed as limiting.

It will be understood that when a layer is referred to as being "on" or "over" another layer, it can be directly on the other element or intervening layers may also be present. In contrast, when a layer is referred to as being "directly on" or "directly over" another layer, there are no intervening layers present. It will also be understood that when a layer is referred to as being "connected" or "coupled" to another layer, it can be directly connected to or coupled to the other layer or intervening layers may be present.

The present disclosure provides a new and improved interconnect structure with bi-layer metal cap having enhanced electromigration resistance. In one embodiment, a vertical sublithographic structure is provided including at least one wiring line, each line having a via opening formed on a dielectric material layer; a conductive material layer filling the via and a bi-layer metallic cap positioned on a top surface of the conductive material layer.

The interconnect structure described herein can be made using conventional techniques of back end of the line (BEOL) processing known to those skilled in the art. Front end of the line (FEOL) and middle end of the line (MOL) processing are also envisioned.

FIGS. 2-8 illustrate structure and method of fabricating an interconnect structure with bi-layer metal cap, according to one embodiment of the present disclosure. With initial reference to FIG. 2, a semiconductor structure is illustrated and is designated generally as semiconductor structure 100. Semiconductor structure 100 includes generally a first dielectric layer 102 formed on a semiconductor substrate (not shown) and a hardmask layer 104 formed over first dielectric layer 102.

Semiconductor substrate may include any of several semiconductor materials well known in the art, such as, for example, a bulk silicon semiconductor substrate, silicon-on-insulator (SOI) and silicon-on-sapphire (SOS). Other non-limiting examples include silicon, germanium, silicon-germanium alloy, silicon carbide, silicon-germanium carbide alloy and compound (i.e. III-V and II-VI) semiconductor materials. Non-limiting examples of compound semiconductor materials include gallium, arsenide, indium arsenide and indium phosphide semiconductor material. Typically, semiconductor substrate may be about, but is not limited to, several hundred microns thick, for example a thickness ranging from about 0.5 mm to about 1.5 mm.

In one embodiment, first dielectric layers 102 includes a dielectric material having a dielectric constant, k, of about 4.0 or less and a thickness ranging from about 200 nm to about 450 nm. Dielectric layer 102 may include any interlevel or intralevel dielectric, and may be porous or non-porous. Suitable materials include, but are not limited to, silicon nitride (SiN), silicon dioxide (SiO2), Si3N4, SiCOH, SiLK (a polyarylene ether available from Dow Chemical Corporation), JSR (a spin-on silicon-carbon contained polymer material available from JSR corporation), silesquioxanes, C doped oxides (i.e. organosilicates) that include atoms of Si, C, O, and/or H, thermosetting polyarylene ethers, etc. or layers thereof. It is to be understood, however, that other materials having different dielectric constant and/or thickness may be employed.

Hardmask layer 104 may be formed using conventional deposition processes, such as, for example, CVD, atomic layer deposition (ALD), physical vapor deposition (PVD), plasma enhanced chemical vapor deposition (PECVD), etc. Hardmask layer 104 may be include any material capable of functioning as an etch stop layer, such as, for example, silicon nitride (Si3N4) and silicon oxinitride (SiOxNy). In one embodiment, hardmask layer 104 includes a thickness ranging from about 5 nm to about 70 nm.

Figure 3:
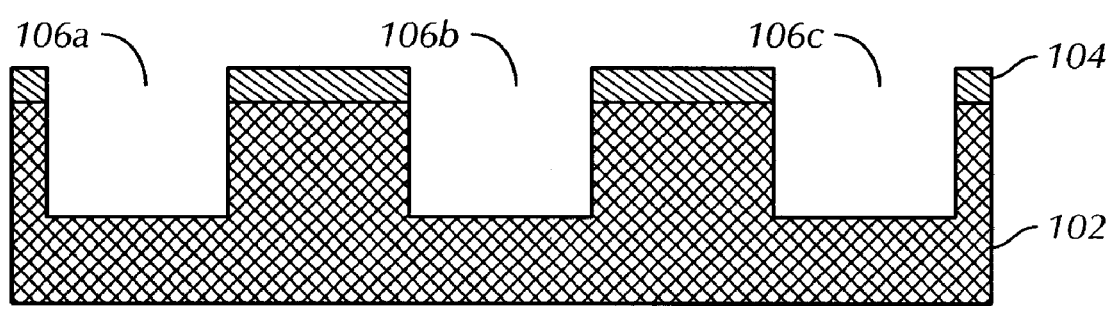

FIG. 3 illustrates a cross-sectional view of semiconductor structure 100 after a plurality of lines 106a, 106b and 106c are formed in dielectric layer 102 and hardmask 104. Lines 106a, 106b and 106c are formed using any conventional lithographic and etching processes. For example, lines 106a, 106b and 106c may be formed using a photolithography process wherein a photoresist layer (not shown) is spin-coated and patterned over hardmask layer 104 to form a photomask through exposure and development using, for example, a deep ultra-violet (UV) light. The photomask serves to define the etching location or portion over dielectric layer 102. Dielectric layer 102 is then partially etched through, as illustrated by the figure, until lines 106a, 106b and 106c are formed. Any suitable etching process may be used, such as reactive ion etching (RIE). After forming lines 106a, 106b and 106c, photoresist layer and any etch residue are removed by a suitable stripping and cleaning process. Hardmask 104 may also removed.

Figure 4:
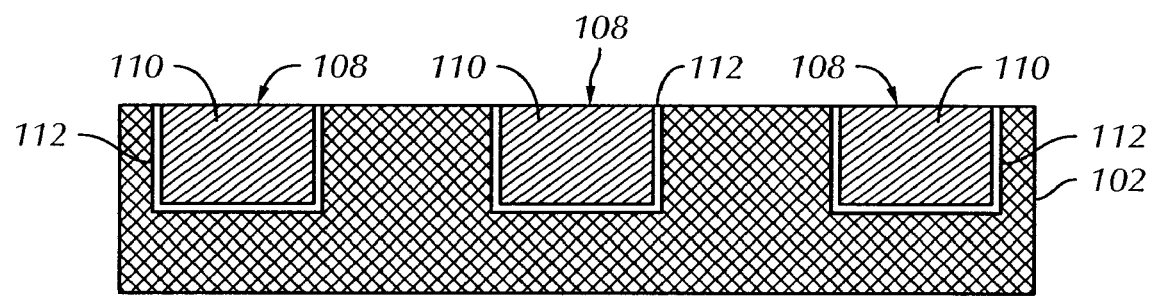
FIGS. 4-8 are simplified cross-sectional views illustrating a sequence of method steps for forming an interconnect structure with bi-layer metal cap, according to a first embodiment of the present disclosure.

FIG. 4 illustrates a cross-sectional view of semiconductor structure 100 after interconnect features 108 are formed. Each interconnect features 108 include a conductive material layer 110 and a highly resistive diffusion barrier or liner 112 to prevent conductive material layer 110 from diffusing. Diffusion barrier 112 is deposited over hardmask 104 and lines 106a, 106b and 106c such that a portion of barrier 112 is formed in the bottom portion of lines 106a, 106b and 106c and the sidewall of dielectric layer 102. Conductive material layer 110 is then deposited over barrier 112 such that lines 106a, 106b and 106c are filled, preferably entirely, with conductive material layer 110. Hardmask 104 and the portion of conductive material layer 110 and diffusion barrier 112 above a top surface of dielectric layer 102 is then removed by any suitable planarization process such as a chemical/mechanical polishing (CMP).

Diffusion barrier 112 includes any material suitable for preventing adverse effects (e.g. pitting, spiking and diffusion) from contact between dielectric layer 102 and conductive material layer 110. Typically, diffusion barrier 112 includes one or more metals such as, for example, Ta, TaN, TiN, Ru, RuN, W, WN, TaSiN, TiW, or any other refractory metals and their nitrides. Moreover, diffusion barrier 112 may include any suitable thickness. In one embodiment, for example, diffusion barrier includes a thickness ranging from about 4 nm to about 40 nm. Diffusion barrier 112 may be deposited by any suitable process, such as by sputter deposition, atomic layer deposition (ALD), or alternatively, a chemical vapor deposition (CVD), physical vapor deposition (PVD), or ionized PVD (iPVD).

Conductive material layer 110 may include any suitable metal such as, for example, Cu, Al, W, Au, Ag, TiN, TaN, Ta, Mo, or alloys thereof. Other suitable conductive materials are also envisioned. Conductive material layer 110 may be deposited using any suitable metallization process such as CVD, PECVD, PVD, sputter deposition, electroplating or electroless plating.

Figure 5:
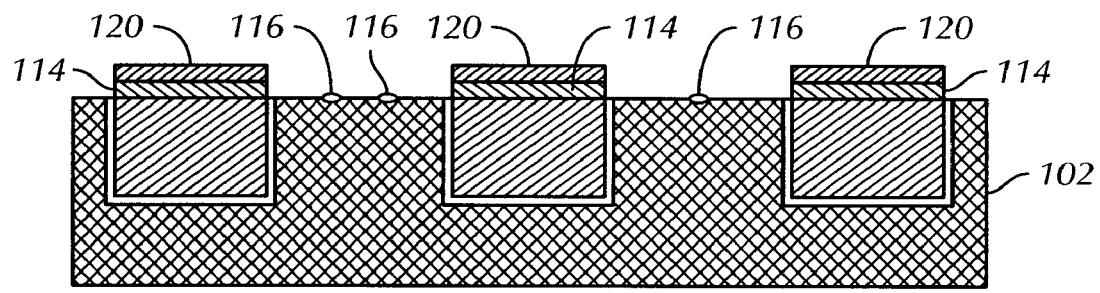

With reference to FIG. 5, a blanket deposition of a metal cap layer 114 is formed over the pattered structure using a suitable deposition technique, such as, for example, ALD, CVD and plating techniques. In one embodiment, metal cap layer 114 includes a thickness ranging from about 2 A to about 50 A. In addition, metal cap layer 114 may be selected from a noble metal to prevent metal cap layer 114 from reacting with Cu and to act as good diffusion barrier. In one embodiment, metal cap layer 114 includes any suitable noble metal, such as, for example, Co, Ir, Ru, Rh, Pd, Pt, Ta, W, B, P, MO, Re and their alloys. As illustrated by the figure, metallic residue 116 forms on the exposed upper surface of dielectric material 102 during the formation of metal cap layer 114.

Figure 6:
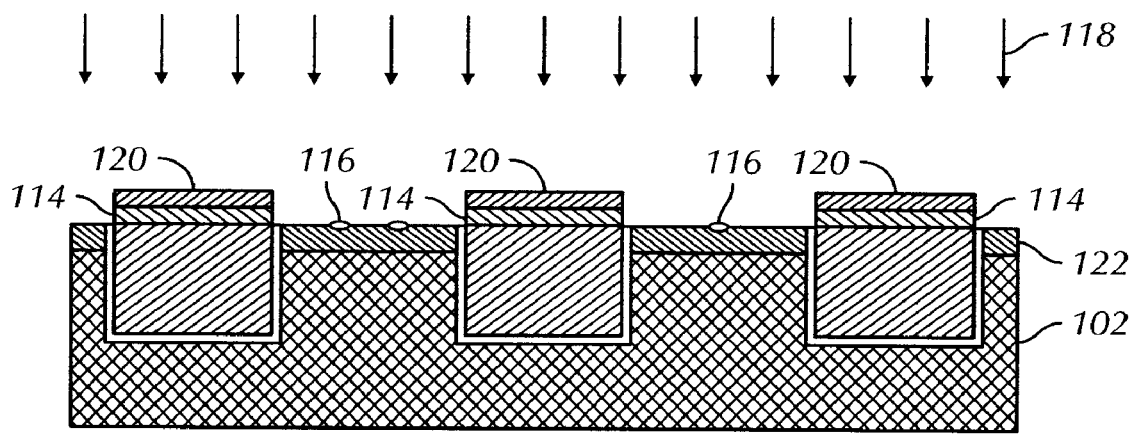

With reference to FIG. 6, a chemical plasma process, such as, for example, NH3/n2 plasma ash/surface treatment, indicated by directional arrow 118, is performed over structure 100 to nitrogenize metal cap layer 114 for forming a metal nitride 120 on a top surface of metal cap layer 114 thus forming a bi-layer metallic cap layer 121. In addition, a surface layer 122 of dielectric layer 102 is damaged due to the chemical plasma process 118. It is noted that the chemical plasma process typically, but not necessarily always, depletes C from dielectric material 102. Although the depth of the damaged surface layer 122 may vary depending on the plasma conditions employed, damaged surface layer 122 includes a thickness apt for enclosing the previously formed metal residues 116. That is, the chemical plasma process consumes a surface portion of dielectric material 102 such that metal residues 116 are present in the damaged surface layer 122. In one embodiment, metal nitride 120 may include a thickness ranging from about 1 A to about 20 A and damaged surface layer 122 may include a thickness ranging from about 3 A to about 100 A. Moreover, metal nitride 120 includes, for example, $Co_xN_y$, $Ir_xN_y$, $Ru_xN_y$, $Rr_xN_y$, $Rh_xN_y$, $Pd_xN_y$, $Pt_xN_y$, $Ta_xN_y$, W, B, P, Mo, Re and a combination thereof.

Figure 7:
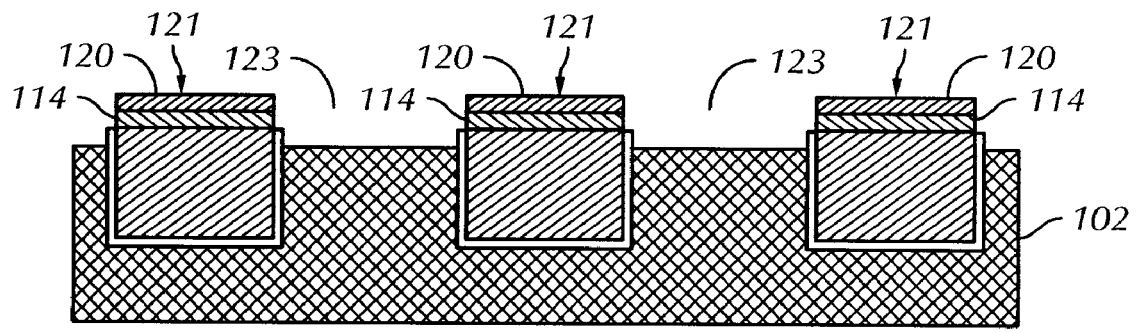

FIG. 7 illustrates the resulting structure following a wet clean treatment to remove damaged surface layer 122 of dielectric layer 102 and any other possible metal residues. Any suitable wet clean treatment may be used, such as, for example, a hydrofluoric acid (HF). As is illustrated, the resultant structure includes a 'recessed' dielectric material 123 and an extended bi-layer metallic cap layer 121.

Figure 8:
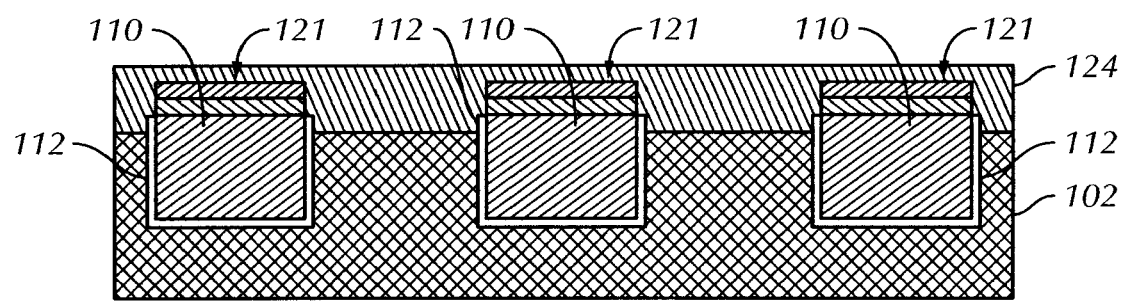

With reference to FIG. 8, a blanket deposition of a dielectric capping layer 124 is formed over structure 100 through, for example, a CVD technique. As illustrated by the figure, the dielectric capping layer 124 covers the upper exposed surface of the dielectric material 102 as well as the extended bi-layer metallic cap layer 121. That is, dielectric capping layer 124 encapsulates the extended top portion of bi-layer metallic cap layer 121. In one embodiment, dielectric layer 124 ranges in thickness from about 5 nm to about 80 nm.

With reference to FIGS. 9-13, a second embodiment of an interconnect structure with bi-layer metal cap is described. In this particular embodiment, the interconnect features are formed within a dielectric layer and a hardmask layer, as described in detail hereinbelow.

Figure 9:
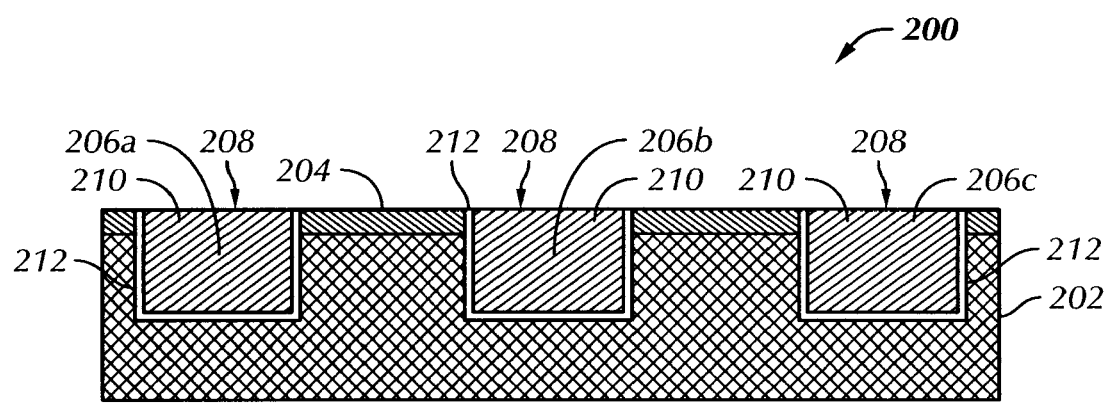
FIGS. 9-13 are simplified cross-sectional views illustrating a sequence of method steps for forming an interconnect structure with bi-layer metal cap, according to another embodiment of the present disclosure.

With initial reference to FIG. 9, a semiconductor structure 200 includes a first dielectric layer 202, a hardmask 204 formed on dielectric layer 202 and interconnect feature 208 formed on a plurality of lines 206a, 260b and 206c. It is noted that, hardmask 204 is not removed from dielectric layer 202 after the planarization process, as described hereinabove with respect to the first embodiment. Interconnect features 208 include a conductive material layer 210 and a barrier or liner 212 formed about lines 206a, 206b and 206c, to prevent conductive material 210 from diffusing.

Figure 10:
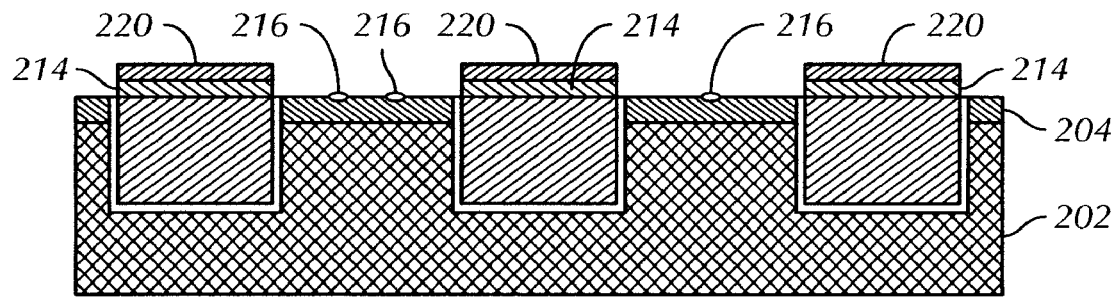

With reference to FIG. 10, a blanket deposition of a first metal cap 214 is formed over the patterned structure using suitable deposition techniques. Metal residue 216 is observed on a top surface of dielectric layer 202.

Figure 11:
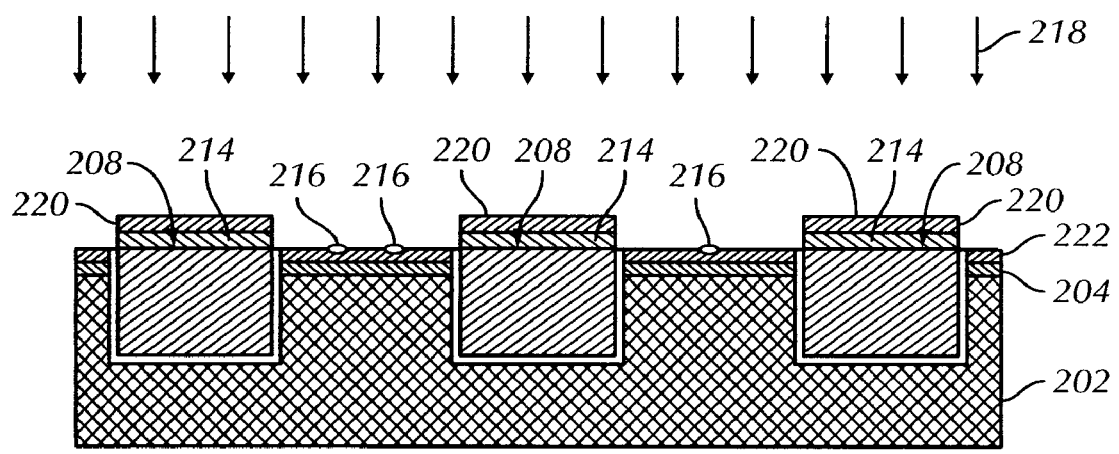

With reference to FIG. 11, a NH3/N2 plasma ash/surface treatment 218 is performed over the structure for creating a metal nitride 220 on a top surface of metal cap 214, and a damaged dielectric layer 222 on a top portion of dielectric layer 102. Metal nitride 220 may include a thickness ranging from about 1 A to about 20 A. In addition, damaged dielectric layer 222 may include a thickness ranging from about 3 A to about 100 A.

Figure 12:
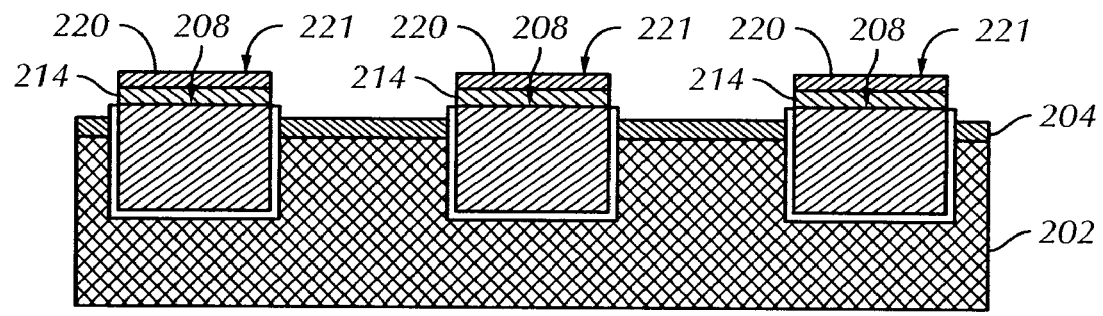
Figure 13:
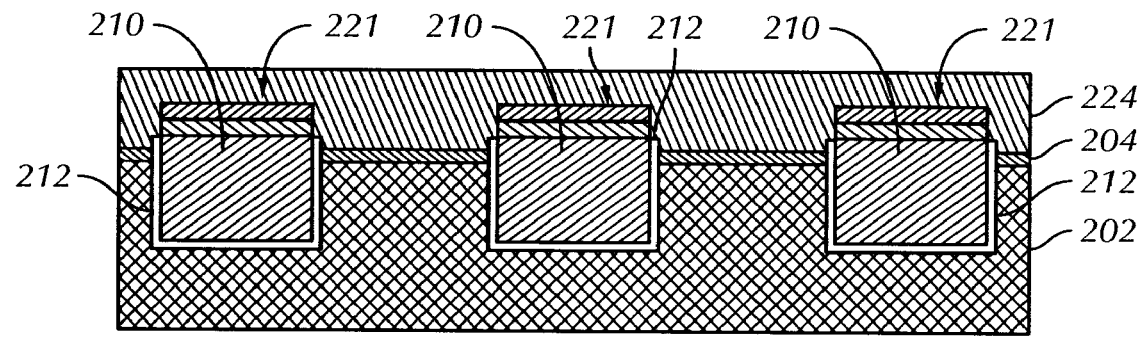
Figure 14:
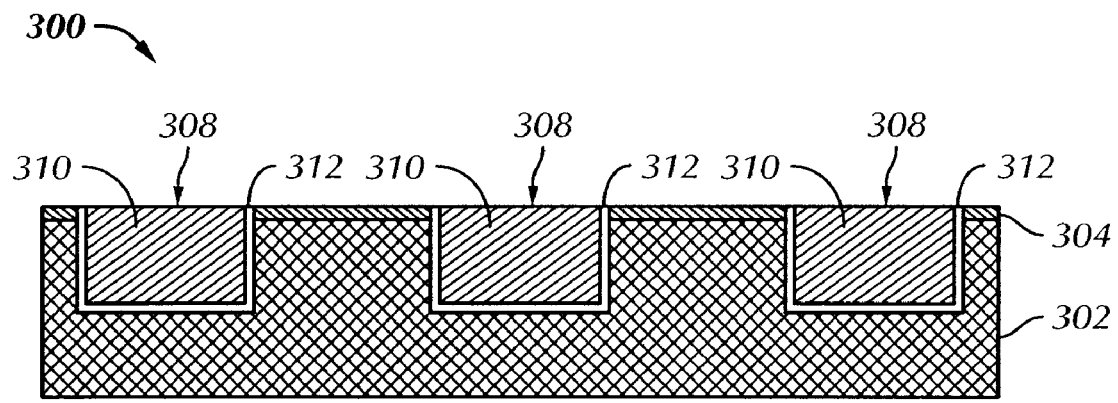
FIGS. 14-20 are simplified cross-sectional views illustrating a sequence of method steps for forming an interconnect structure with bi-layer metal cap, according to yet another embodiment of the present disclosure.

FIG. 12, illustrates the resulting structure following a wet clean treatment using, for example, a dilute HF to remove damaged dielectric layer 222 and any other possible metal residues. The resulting structure includes bi-layer metallic capping layer 221 extended from hardmask 214. Finally, with reference to FIG. 13, a blanket deposition of a dielectric capping layer 224 is formed over structure 200 through, for example, a CVD technique. As illustrated by the figure, dielectric capping layer 224 covers metallic cap layer 221. In one embodiment, dielectric layer 224 ranges in thickness from about 5 nm to about 80 nm.

With reference to FIGS. 14-20, another alternative embodiment of an interconnect structure having bi-layer metal cap is described. With initial reference to FIG. 14, structure 300 includes a first dielectric layer 302; a hardmask 304 formed on dielectric layer 302; and interconnect features 308 formed within dielectric layer 302 and hardmask 304. Interconnect features 308 include a conductive material layer 310 and a barrier or liner 312 about conductive material layer 310 to prevent conductive material layer 310 from diffusing.

Figure 15:
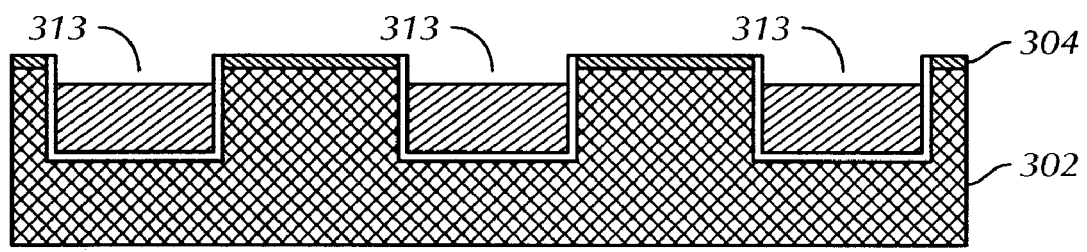
Figure 16:
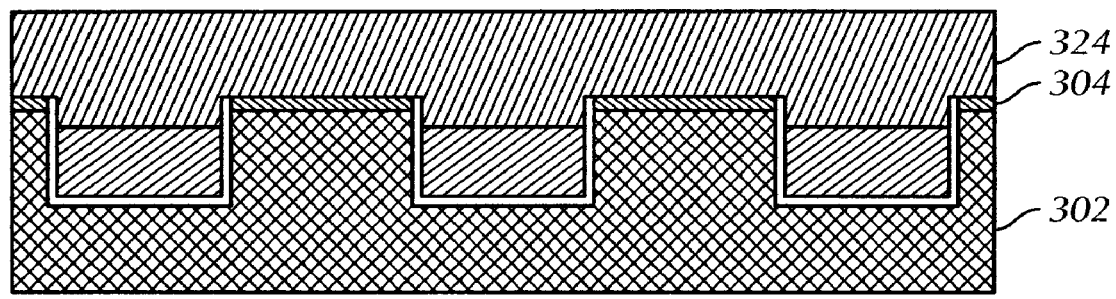

With reference to FIG. 15, an isotropic wet etching process is used for partially removing conductive material 310 and forming openings 313 on a portion of conductive material layer 310. A blanket deposition of a metal cap 314 is then formed over the patterned structure, filling openings 313 (FIG. 16).

Figure 17:
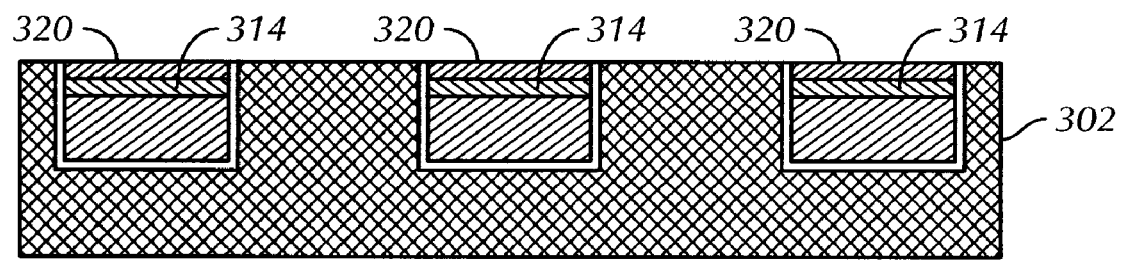
Figure 18:
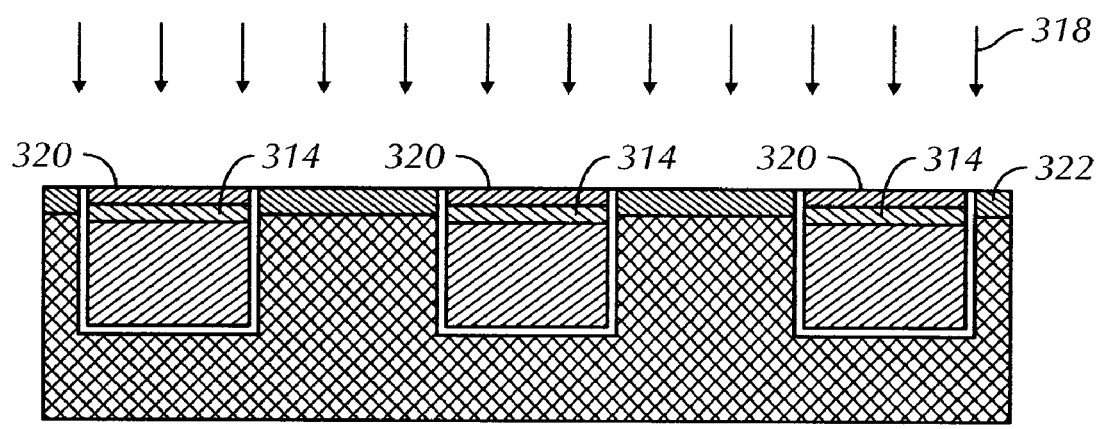

With reference to FIG. 17, a CMP is performed for removing first metal cap 314 and hardmask layer 304 from dielectric layer 302. With reference to FIG. 18, a NH3/N2 plasma ash/surface treatment 318 is the performed over the structure for creating a metal nitride 320 on a top surface of metal cap 314, and a damaged dielectric layer 322 on a top portion of dielectric layer 302. Metal nitride 320 may include a thickness ranging from about 1 A to about 30 A. In addition, damaged dielectric layer 322 may include a thickness ranging from about 3 A to about 100 A.

Figure 19:
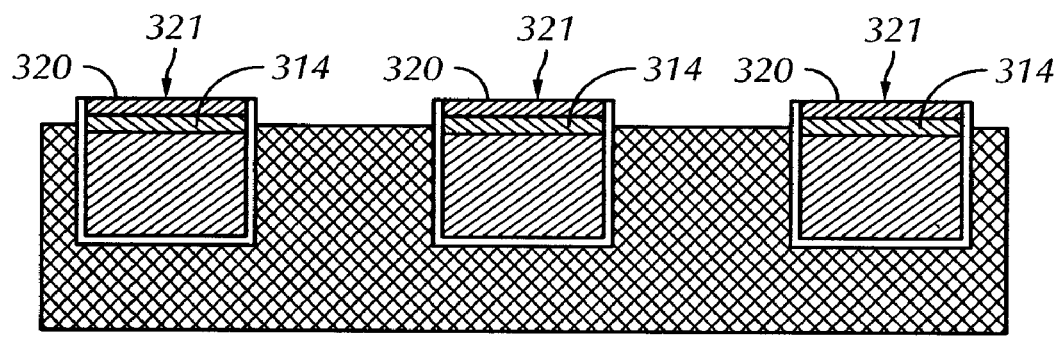
Figure 20:
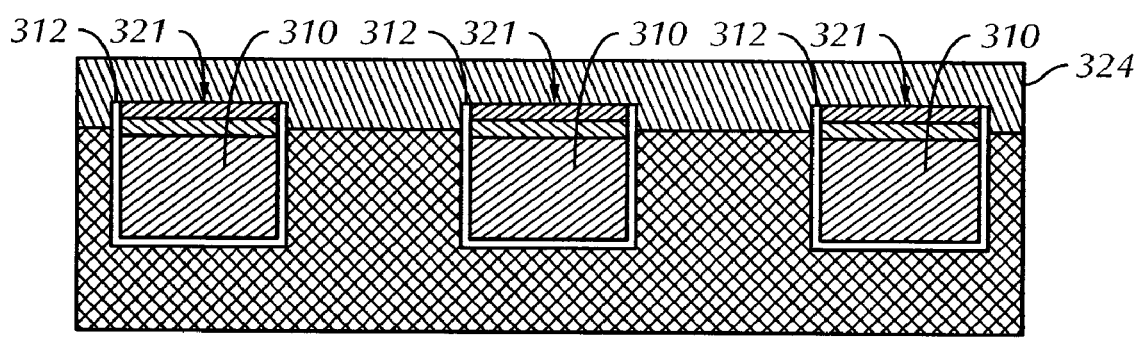

FIG. 19 illustrates the resulting structure following a wet clean treatment using, for example, a dilute HF to remove damaged dielectric layer 332 and any other possible metal residues. Finally, with reference to FIG. 20, a blanket deposition of a second dielectric layer 324 is formed over structure 300 through, for example, a CVD technique. In one embodiment, second dielectric layer 324 ranges in thickness from about 5 nm to about 80 nm.

It will be understood that numerous modifications and changes in form and detail may be made to the embodiments of the presently disclosed structure and method of forming an interconnect structure for semiconductor devices. It is contemplated that numerous other configuration of the interconnect structure may be used, and the material of the structures and method may be selected from numerous materials other than those specifically disclosed. Therefore, the above description should not be construed as limiting the disclosed structure and method, but merely as exemplification of the various embodiments thereof. Those skilled in the art will envisioned numerous modifications within the scope of the present disclosure as defined by the claims appended hereto. Having thus complied with the details and particularity required by the patent laws, what is claimed and desired protected is set forth in the appended claims.

What is claimed is:

1. A method of fabricating an interconnect structure, the method comprising:
   forming at least one interconnect feature in a dielectric material layer;
   forming a bi-layer metallic cap on a top surface of said at least one interconnect feature;
   wherein said forming said bi-layer metallic cap includes:
      forming a metal capping layer on a conductive surface of said at least one interconnect feature; and
      conducting a chemical plasma process for forming a metal nitride on a top portion of said metal capping layer; and
   wherein a surface layer of said dielectric material layer is damaged during said chemical plasma process and further comprising removing said damaged surface layer.

2. The method of fabricating an interconnect structure as recited in claim 1, further comprising depositing a blanket layer of a dielectric capping layer, wherein said depositing covers an exposed surface of said dielectric material layer and a surface of said bi-layer metallic cap.

3. The method of fabricating an interconnect structure as recited in claim 1, wherein said metal capping layer includes a noble metal.

4. The method of fabricating an interconnect structure as recited in claim 3, wherein said noble metal is selected from a group consisting of Co, Ir, Ru, Rh, Pd, Pt, Ta, W, B, P, MO, Re, and a combination thereof.

5. The method of forming an interconnect structure as recited in claim 1, further comprising forming a hardmask on a top portion of said dielectric material, wherein said interconnect features is embedded within said dielectric material layer and said hardmask and further wherein said interconnect feature includes a conductive surface being coplanar with a top surface of said hardmask.

6. The method of fabricating an interconnect structure as recited in claim 1, wherein said forming at least one interconnect feature includes:
   forming at least one of a line and a via features in said dielectric material layer;
   conformally depositing a barrier layer in said at least one of a line and a via; and
   depositing a metal layer over said barrier layer.

7. The method of fabricating an interconnect structure as recited in claim 6, wherein said metal layer is selected from a group consisting of Cu, W, Al and Cu alloys.

8. The method of fabricating an interconnect structure as recited in claim 6, wherein said bi-layer metallic cap is formed within said at least one of a line and a via features.

9. The method of fabricating an interconnect structure as recited in claim 6, further comprising partially etching said conductive material layer for forming a recessed top conductive surface, wherein said bi-layer metallic cap is formed on said recessed top conductive surface.

10. The method of fabricating an interconnect structure as recited in claim 1, wherein said at least one interconnect feature includes a conductive surface coplanar with a top surface of said dielectric material layer and further wherein said metal capping layer is formed on said conductive surface.

* * * * *